US010644082B2

United States Patent
Yokota et al.

(10) Patent No.: US 10,644,082 B2
(45) Date of Patent: May 5, 2020

(54) ORGANIC EL ELEMENT WITH INORGANIC INSULATION LAYER AND METHOD FOR PRODUCTION THEREOF

(71) Applicant: JOLED INC., Tokyo (JP)

(72) Inventors: Kazuhiro Yokota, Tokyo (JP); Hideyuki Shirahase, Tokyo (JP); Takahiro Komatsu, Tokyo (JP); Masaki Nishimura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/722,407

(22) Filed: Oct. 2, 2017

(65) Prior Publication Data
US 2018/0097050 A1 Apr. 5, 2018

(30) Foreign Application Priority Data
Oct. 5, 2016 (JP) .................. 2016-197349

(51) Int. Cl.
*H01L 27/32* (2006.01)
*H01L 51/52* (2006.01)
*H01L 51/00* (2006.01)
*H01L 51/56* (2006.01)

(52) U.S. Cl.
CPC ...... *H01L 27/3246* (2013.01); *H01L 27/3258* (2013.01); *H01L 51/0005* (2013.01); *H01L 51/5209* (2013.01); *H01L 51/5215* (2013.01); *H01L 51/5253* (2013.01); *H01L 51/56* (2013.01); *H01L 2227/323* (2013.01); *H01L 2251/303* (2013.01)

(58) Field of Classification Search
CPC ............ H01L 27/3246; H01L 27/3258; H01L 51/0005
See application file for complete search history.

(56) References Cited

U.S. PATENT DOCUMENTS

| 2001/0011868 | A1  | 8/2001 | Fukunaga et al. |
|---|---|---|---|
| 2006/0153971 | A1* | 7/2006 | Takehara ............ H01L 51/0007 427/66 |
| 2007/0117257 | A1* | 5/2007 | Kim .................... H01L 27/12 438/99 |

(Continued)

FOREIGN PATENT DOCUMENTS

| JP | 2005-227519 A | 8/2005 |
|---|---|---|
| JP | 2011-009790 A | 1/2011 |

*Primary Examiner* — Thao X Le
*Assistant Examiner* — Xia L Cross
(74) *Attorney, Agent, or Firm* — Chip Law Group

(57) ABSTRACT

An organic EL element includes a planarized layer arranged on a substrate, an insulation layer which is arranged on the planarized layer with the region corresponding to a subpixel of the planarized layer left exposed at least partly, a pixel electrode which has an opening that defines the region corresponding to the subpixel and which is arranged on a bank arranged on the insulation layer and on the exposed part of the planarized layer, a transparent conductive layer arranged on the pixel electrode, an emission layer arranged in the opening and above at least the transparent conductive layer, and a counter electrode arranged above the emission layer. The insulation layer is interposed between a bottom of the bank and the planarized layer. An upper surface of the planarized layer is coated with at least one of the pixel electrode and the insulation layer.

12 Claims, 13 Drawing Sheets

(56) References Cited

U.S. PATENT DOCUMENTS

| | | | | |
|---|---|---|---|---|
| 2008/0309232 A1* | 12/2008 | Yamamoto | .......... | H01L 51/5265 313/505 |
| 2009/0134783 A1* | 5/2009 | Lin | ...................... | C07D 235/18 313/504 |
| 2011/0018007 A1* | 1/2011 | Kasahara | ............ | H01L 27/3246 257/88 |
| 2011/0101398 A1* | 5/2011 | Uchida | ............... | H01L 27/3211 257/98 |
| 2014/0042408 A1* | 2/2014 | Akagawa | ............ | H01L 51/5253 257/40 |
| 2014/0183472 A1* | 7/2014 | Kim | ................... | H01L 27/3258 257/40 |
| 2015/0001486 A1* | 1/2015 | Kim | ................... | H01L 27/3246 257/40 |
| 2016/0093822 A1* | 3/2016 | Chang | ................ | H01L 51/5008 257/40 |
| 2016/0197126 A1* | 7/2016 | Yoo | .................... | H01L 27/3283 257/40 |

* cited by examiner

ORGANIC EL ELEMENT WITH INORGANIC INSULATION LAYER AND METHOD FOR PRODUCTION THEREOF

CROSS REFERENCE TO RELATED APPLICATIONS

This application claims priority benefit of Japanese Patent Application No. JP 2016-197349 filed in the Japan Patent Office on Oct. 5, 2016. Each of the above-referenced applications is hereby incorporated herein by reference in its entirety.

BACKGROUND

The present disclosure relates to an organic electroluminescence (EL) element and a method for production thereof.

Display apparatuses based on an organic EL element are prevailing nowadays. The organic EL element is characterized by good visibility owing to its self luminescence and high impact resistance inherent in solid-state device.

Being a current-driven element, the organic EL element is composed of paired electrodes and functional laminated layers interposed between them. The electrodes are a pixel electrode and a counter electrode. The functional layers include an organic luminescence layer capable of electroluminescence by carrier recombination and a hole injection layer or an electron injection layer to promote carrier injection from the anode and the cathode.

Moreover, the organic EL element additionally has an interlayer insulation layer and a layer called bank. The former is intended to planarize the substrate surface on which are formed thin film transistors (TFTs). It helps the organic luminescent layer to be formed uniform in thickness. The bank defines the area for luminescence (see Japanese Patent Laid-open No. 2005-227519, for example).

In addition, the organic EL element may have a metal thin film coated with a transparent conductive layer formed from a metal oxide such as indium tin oxide (ITO) and indium zinc oxide (IZO) (see Japanese Patent Laid-open No. 2011-9790, for example).

SUMMARY

The planarized layer and the bank are formed from resin and hence they are permeable to moisture. For this reason, the moisture which has attached to the surface of the planarized layer during manufacturing process permeates the bank to reach the transparent conductive layer after the completion of products. The moisture permeation deteriorates the transparent conductive layer. This, in turn, leads to deteriorated hole current, which causes problems with the increased driving voltage and the decreased emission life.

The present disclosure was completed in view of the foregoing. It is an object of the present disclosure to provide an organic EL display panel which is saved from the increased driving voltage and the decreased emission life.

The organic EL display panel according to one mode of the present disclosure includes a substrate, a planarized layer arranged on the substrate, an insulation layer of inorganic material which is arranged on the planarized layer in such a way that the region corresponding to a subpixel of the planarized layer is left exposed at least partly, a pixel electrode which has an opening that defines the region corresponding to the subpixel and which is arranged on a bank arranged on the insulation layer and on the exposed part of the planarized layer, a transparent conductive layer arranged on the pixel electrode, an emission layer arranged in the opening and above at least the transparent conductive layer, and a counter electrode arranged above the emission layer. The insulation layer is interposed all over between a bottom of the bank and the planarized layer. An upper surface of the planarized layer is coated with at least one of the pixel electrode and the insulation layer.

The organic EL display panel according to one mode of the present disclosure is constructed such that the insulation layer of inorganic material is interposed all over between the planarized layer and the bottom of the bank. This structure prevents moisture adsorbed to the surface of the planarized layer from migrating to the bank and hence prevents moisture from migrating to the transparent conductive layer through the bank. This protects the transparent conductive layer from deterioration due to moisture. Thus, the resulting organic EL element works with a low driving voltage and has an extended emission life.

BRIEF DESCRIPTION OF THE DRAWINGS

FIG. 5A is a partial sectional view illustrating a state in which a substrate is coated with a TFT layer. FIG. 5B is a partial sectional view illustrating a state in which the TFT layer is coated with a planarized layer. FIG. 5C is a partial sectional view illustrating a state in which the planarized layer is coated with an insulation layer. FIG. 5D is a partial sectional view illustrating a state in which the planarized layer and the insulation layer are coated with a layer of pixel electrode material;

FIG. 6A is a partial sectional view illustrating a state in which the layer of pixel electrode material is coated with a layer of transparent conductive material. FIG. 6B is a partial sectional view illustrating a state in which the layer of transparent conductive material is coated with a layer of hole injection material.

FIG. 6C is a partial sectional view illustrating a state in which a pixel electrode, a transparent conductive layer, and a hole injection layer are formed;

FIG. 7A is a partial sectional view illustrating a state in which the layer of material for a first bank is formed. FIG. 7B is a partial sectional view illustrating a state in which the first bank is formed. FIG. 7C is a partial sectional view illustrating a state in which the layer of material for a second bank is formed;

FIG. 8A is a partial sectional view illustrating a state in which the second bank is formed and a bank is completed. FIG. 8B is a partial sectional view illustrating a state in which the hole injection layer (in the opening for the bank) is coated with an emission layer;

FIG. 9A is a partial sectional view illustrating a state in which the emission layer and the bank are coated with an electron injection layer. FIG. 9B is a partial sectional view illustrating a state in which the electron injection layer is coated with a counter electrode. FIG. 9C is a partial sectional view illustrating a state in which the counter electrode is coated with a seal layer;

DETAILED DESCRIPTION OF THE PREFERRED EMBODIMENTS

<<Overview of Mode of Disclosure>>

An organic EL element according to one mode of the present disclosure includes a substrate, a planarized layer arranged on the substrate, an insulation layer of inorganic material which is arranged on the planarized layer in such a way that a region corresponding to a subpixel of the planarized layer is left exposed at least partly, a pixel electrode which has an opening that defines the region corresponding to the subpixel and which is arranged on the bank arranged on the insulation layer and on the exposed part of the planarized layer, a transparent conductive layer arranged on the pixel electrode, an emission layer arranged in the opening and above at least the transparent conductive layer, and a counter electrode arranged above the emission layer, with the insulation layer being interposed all over between the bottom of the bank and the planarized layer, and with the upper surface of the planarized layer being coated with at least one of the pixel electrode and the insulation layer.

In the organic EL element according to one mode of the present disclosure, the insulation layer may continuously extend from a part between the planarized layer and the bank to a part between the peripheral part of the pixel electrode and the planarized layer.

In the organic EL element according to one mode of the present disclosure, the insulation layer may continuously extend from a part between the planarized layer and the bank to a part between the peripheral part of the pixel electrode and the transparent conductive layer.

In the organic EL element according to one mode of the present disclosure, a laminate consisting of the pixel electrode and the transparent conductive layer may have its peripheral part overlapped with the bank in the plan view.

In the organic EL element according to one mode of the present disclosure, the laminate consisting of the pixel electrode and the transparent conductive layer may be separate from the bank in the opening.

In the organic EL element according to one mode of the present disclosure, the insulation layer may be formed from an inorganic material which has a higher light absorptivity than the material for the bank.

In the organic EL element according to one mode of the present disclosure, the light-absorptive inorganic material may be chromium oxide.

The present disclosure produces profound effects owing to the unique structure as explained below with reference to typical examples.

Incidentally, the embodiments to be described below are intended to elucidate the structure and effect of the organic EL element according to one mode of the present disclosure but not to restrict the scope of the present disclosure.

Embodiment 1

[1. Overall Structure of Organic EL Display Apparatus]

An organic EL display element according to Embodiment 1 is a constituent of the organic EL display apparatus which is explained below with reference to FIG. 1.

Figure 1:
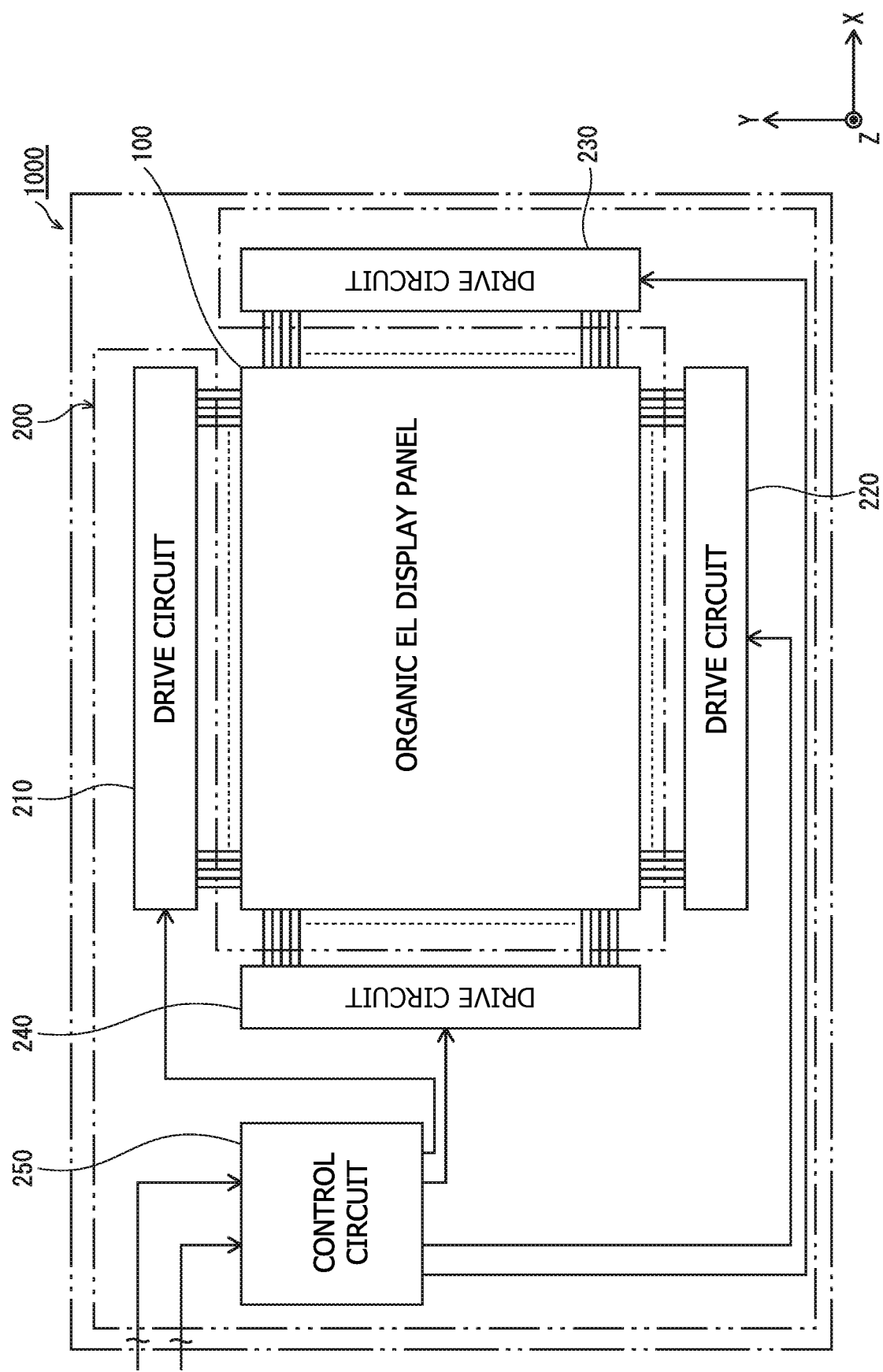
FIG. 1 is a schematic block diagram illustrating the structure of an organic EL display apparatus pertaining to Embodiment 1 of the present disclosure.
Figure 2:
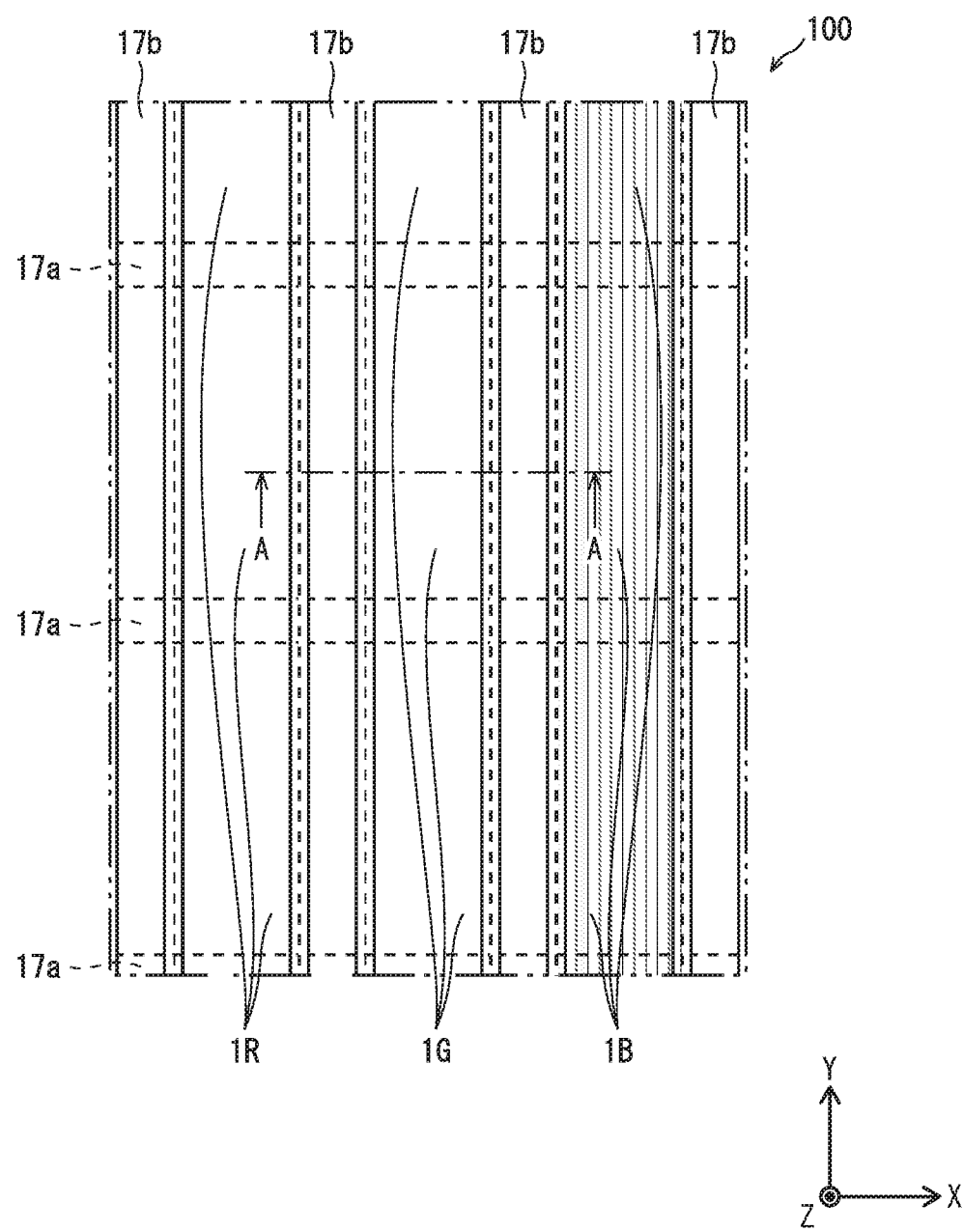
FIG. 2 is a schematic plan view illustrating the arrangement of subpixels in an organic EL display panel illustrated in FIG. 1.
Figure 3:
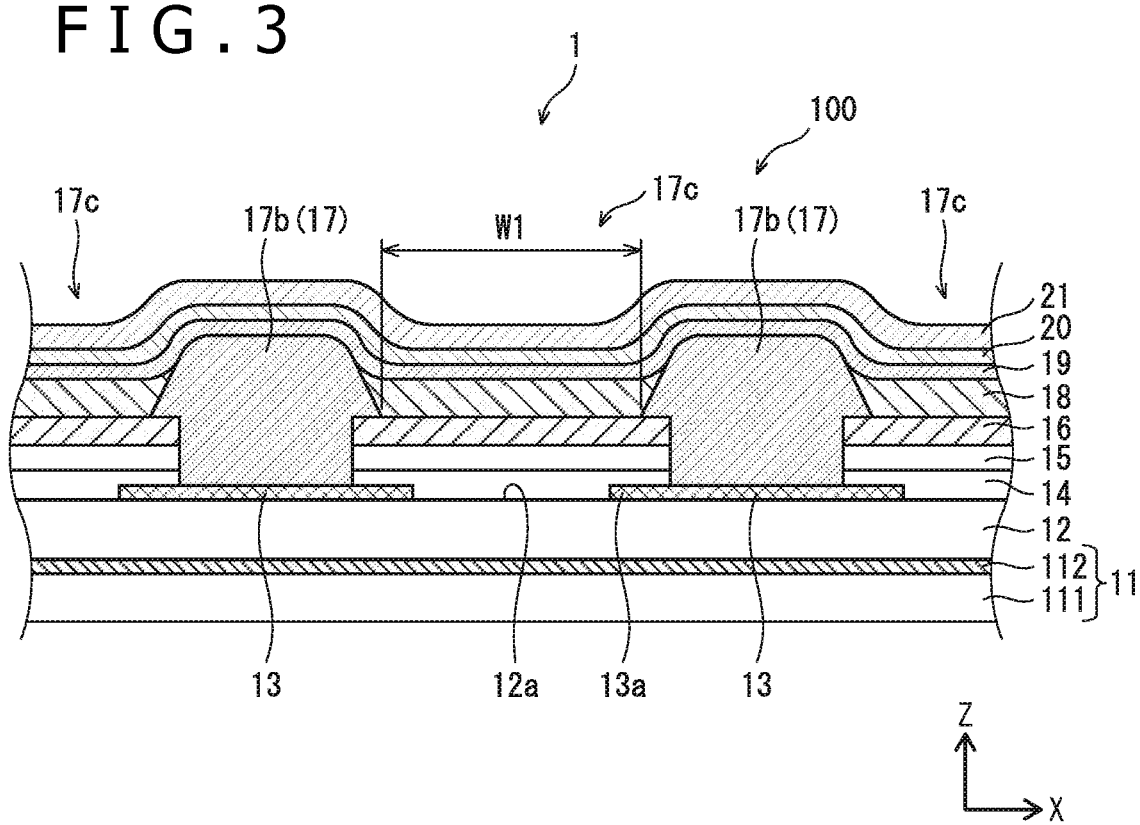
FIG. 3 is a schematic sectional view taken along a line A-A in FIG. 2, illustrating an organic EL element pertaining to Embodiment 1.

An organic EL display apparatus 1000 is constructed as illustrated in FIG. 1 which is a schematic block diagram. It should be noted from FIG. 1 that the organic EL display apparatus 1000 includes an organic EL display panel 100 and a drive control unit 200 connected thereto. The organic EL display panel 100 is a panel which utilizes the electroluminescence of an organic material. It is composed of a plurality of organic EL elements 1, which are arranged in a matrix pattern, as illustrated in FIGS. 2 and 3. The drive control unit 200 includes four drive circuits 210 to 240 and one control circuit 250.

The foregoing is merely exemplary and is not intended to restrict the actual arrangement of the organic EL display panel 100 and the drive control unit 200 in the organic EL display apparatus 1000.

[2. Structure of Organic EL Display Panel 100]

The image display surface of the organic EL display panel 100 is illustrated in FIG. 2 which is a partly enlarged schematic plan view. It is to be noted from FIG. 2 that the organic EL display panel 100 pertaining to this embodiment has the so-called line bank structure. In other words, the organic EL display panel 100 is provided with a plurality of first banks 17a and a plurality of second banks 17b. The first banks 17a extend along the X-axis and separate from each other along the Y-axis. The second banks 17b extend along the Y-axis and separate from each other along the X-axis.

An adjoining pair of the first banks 17a and an adjoining pair of the second banks 17b define the region in which are formed any one of the organic EL elements 1R, 1G, and 1B. The region functions as the subpixel, and the subpixel has a length (for example, 300 µm) in the Y-direction.

The organic EL element 1R emits red light (R), the organic EL element 1G emits green light (G), and the organic EL element 1B emits blue light (B). The three organic EL elements 1R, 1G, and 1B adjoining in the X-direction constitute one pixel. Incidentally, these three organic EL elements will be collectively referred to as the organic EL element 1 hereinafter unless it is necessary to specify the luminescence color.

The first bank 17a may have a height equivalent to 40% to 70% of that of the second bank 17b, preferably 50% to 55%. The first and second banks 17a and 17b will be collectively referred to as the bank 17 unless discrimination between them is necessary.

[3. Structure of Organic EL Element]

The organic EL element 1 pertaining to this embodiment is constructed as explained below with reference to FIG. 3.

FIG. 3 is a schematic sectional view of the organic EL display panel 100, which is taken along a line A-A in FIG. 2. It illustrates one part corresponding to one organic EL element 1. It is assumed in this embodiment that one organic EL element 1 corresponds to one pixel (subpixel). The organic EL display panel 100 is that of so-called top-emission type, with the upper side illustrated in FIG. 3 being the display surface.

As illustrated in FIG. 3, the organic EL display panel 100 includes a substrate 11, a planarized layer 12, an insulation layer 13, a pixel electrode 14, a transparent conductive layer 15, a hole injection layer 16, the bank 17, an emission layer 18, an electron transport layer 19, a counter electrode 20, and a seal layer 21. Incidentally, the substrate 11, the planarized layer 12, the electron transport layer 19, the counter electrode 20, and the seal layer 21 are formed for all of the organic EL elements 1 which the organic EL display panel 100 has in common, instead of being formed for individual pixels.

<Substrate>

The substrate 11 is composed of a base material 111 (which is a resin as an insulating material) and a TFT layer 112. The TFT layer 112 is provided with a drive circuit for each pixel. The base material 111 is formed from any insulating resin such as polyimide resin, acrylic resin, styrene resin, polycarbonate resin, epoxy resin, polyethersulfone, polyethylene, polyester, and silicone resin. The base material 111 in this embodiment is formed, for example, from polyimide resin in particular.

<Planarized Layer>

The planarized layer 12 is arranged on the substrate 11 so as to eliminate steps in the upper surface of the TFT layer 112. It is formed from a resinous material such as photosensitive material of positive type, whose examples include acrylic resin, polyimide resin, siloxane resin, and phenolic resin. In addition, the planarized layer 12 has a contact hole for each pixel, which is not illustrated in the sectional diagram of FIG. 2.

<Insulation Layer>

The insulation layer 13 is composed of an inorganic material having electrical insulating properties and low moisture permeability. The insulation layer 13 is arranged on the planarized layer 12 in such a way that the insulation layer 13 permits the planarized layer 12 to expose itself over at least part of an opening 17c of the bank 17, which is the region corresponding to the subpixel (the part will be referred to as "exposed part 12a" hereinafter). In other words, the insulation layer 13 is arranged on the planarized layer 12 excluding the exposed part 12a in the opening 17c, and the exposed part 12a of the planarized layer 12 is not covered with the insulation layer 13.

The insulation layer 13 may be formed from an inorganic material such as silicon nitride (SiN), silicon oxide (SiO), chromium oxide, and molybdenum oxide.

<Pixel Electrode>

The pixel electrode 14 is arranged on the exposed part 12a of the planarized layer 12 and also on the peripheral parts 13a of the insulation layer 13 surrounding the exposed part 12a. In other words, the pixel electrode 14 is so arranged as to cover the exposed part 12a of the planarized layer 12 and the peripheral parts 13a of the insulation layer 13. The pixel electrode 14 is formed from a conductive material, and it functions as an anode. The pixel electrode 14 is formed for each subpixel, and it is electrically connected to the TFT layer 112 through the contact hole. Since the organic EL display panel 100 according to this embodiment is of top-emission type, the pixel electrode 14 may preferably have light reflectivity. The electrical conductive material having light reflectivity includes such metals and alloys as silver (Ag), aluminum (Al), aluminum alloy, molybdenum (Mo), APC (silver-palladium-copper alloy), ARA (silver-rubidium-gold alloy), MoCr (molybdenum-chromium alloy), MoW (molybdenum-tungsten alloy), and NiCr (nickel-chromium alloy).

<Transparent Conductive Layer>

The transparent conductive layer 15 is formed from a material capable of light transmission and electrical conduction; it is arranged on the pixel electrode 14. The material capable of light transmission and electrical conduction includes, for example, ITO, IZO, and zinc oxide (ZnO).

<Hole Injection Layer>

The hole injection layer 16 is arranged on the pixel electrode 14. It helps accelerate the injection of holes from the pixel electrode 14 into the emission layer 18. It is made from an oxide of such metal as silver (Ag), molybdenum (Mo), chromium (Cr), vanadium (V), tungsten (W), nickel (Ni), and iridium (Ir), or conductive polymer, such as PEDOT (mixture of polythiophene and polystyrene sulfonic acid). If made from any metal oxide listed above, the resulting hole injection layer 16 has such a large work function as to stably inject holes into the emission layer 18 or to help generate holes. According to this embodiment, the hole injection layer 16 is one which is made from a metal oxide, such as tungsten oxide.

If the metal oxide is a transition metal oxide, the resulting hole injection layer 16 will have a plurality of levels since any transition metal has a plurality of oxidation numbers. This facilitates hole injection, which leads to a lower drive voltage.

<Bank>

The bank 17 is arranged on the insulation layer 13 in such a way that it covers the peripheral part of the hole injection layer 16, leaving the remaining parts exposed. The bank 17 leaves the uncovered region (called "opening 17c" hereinafter) above the hole injection layer 16; this region corresponds to the subpixel. In other words, the bank 17 has the opening 17c for each subpixel, and the opening 17c defines the region corresponding to the subpixel.

According to this embodiment, the bank 17 is formed on the planarized layer 12 except for the region where the pixel electrode 14 is formed. In other words, the bank 17 has its bottom in contact with the planarized layer 12 except for the region where the pixel electrode 14 is formed.

The bank 17 is formed from an insulating organic material, such as acrylic resin, polyimide resin, novolak resin, and phenolic resin. It functions as a part that prevents the overflow of ink to form the emission layer 18, or as a part that holds the mask for vapor deposition to form the emission layer 18. According to this embodiment, the bank 17 is formed from a resin material, such as photosensitive material of positive type, which includes, for example, acrylic resin, polyimide resin, siloxane resin, and phenolic resin. Phenolic resin is used in this embodiment.

<Emission Layer>

The emission layer 18 is arranged inside the opening 17c. It emits three kinds of light colored in red, green, and blue, which result from the recombination of holes and electrons. It may be formed from any one of the following known fluorescent materials, for example, oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound, azaquinolone compound, pyrazoline derivative, pyrazolone derivative, rhodamine compound, chrysene compound, phenanthrene compound, cyclopentadiene compound, stilbene compound, diphenylquinone compound, styryl compound, butadiene compound, dicyanomethylenepyrane compound, dicyanomethylenethiopyrane compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and Group III metal, oxine metal complex, and rare earth complex.

The emission layer 18 in this embodiment is formed by ink-jet wet process.

<Electron Transport Layer>

The electron transport layer 19 is arranged on the bank 17 and the emission layer 18. In other words, the electron transport layer 19 functions as a single layer common to the subpixels. It transports electrons injected from the counter electrode 20 into the emission layer 18. It is formed from oxadiazole derivative (OXD), triazole derivative (TAZ), phenanthroline derivative (BCP, Bphen), or the like.

<Counter Electrode>

The counter electrode 20 is arranged on the electron transport layer 19. It is common to the subpixels and it functions as a cathode. It is formed from a conductive transparent material, such as ITO and IZO.

<Seal Layer>

The seal layer 21 is arranged on the counter electrode 20. It functions as a barrier against external moisture and oxygen, thereby protecting the emission layer 18 from deterioration by moisture and oxygen. Since the organic EL display panel 100 is of top-emission type, it is formed from a transparent material such as SiN, silicon oxide nitride (SiON), and the like.

<Others>

The seal layer 21 may be coated with additional layers, such as color filter and upper substrate, which are not illustrated in FIG. 3. The upper substrate functions as an additional barrier to preclude moisture and oxygen that might otherwise attack the hole injection layer 16, the emission layer 18, and the electron transport layer 19.

[4. Protection of Transparent Conductive Layer from Deterioration]

The organic EL element 1 according to this embodiment has the insulation layer 13 between the planarized layer 12 and the bank 17. The insulation layer 13 evenly exists between the planarized layer 12 and the bottom of the bank 17. Owing to its low moisture permeability, the insulation layer 13 protects the bank 17 from moisture adsorbed onto the surface of the planarized layer 12. As a result, there will be no moisture movement from the planarized layer 12 to the transparent conductive layer 15 through the bank 17.

The pixel electrode 14 is formed from a metallic material with low moisture permeability. Thus, it prevents the moisture adsorbed onto the surface of the planarized layer 12 from moving to the transparent conductive layer 15. It does not entirely cover the upper surface of the planarized layer 12, but the uncovered part is covered with the insulation layer 13, and the insulation layer 13 has its peripheral part 13a covered with the pixel electrode 14. In other words, the planarized layer 12 has its upper surface covered with at least one of the pixel electrode 14 and the insulation layer 13. This means that there is no gap for moisture permeation between the insulation layer 13 and the pixel electrode 14. The result is a complete absence of moisture movement from the surface of the planarized layer 12 to the transparent conductive layer 15.

The foregoing indicates that the organic EL element 1 according to this embodiment is so constructed as to prevent moisture movement from the surface of the planarized layer 12 to the transparent conductive layer 15. This protects the transparent conductive layer 15 from deterioration. Thus, the resulting organic EL element 1 works with a low driving voltage and has an extended emission life.

Although there is a possibility that minute holes or missing parts occur in the insulation layer 13 and the pixel electrode 14 for various reasons in the manufacturing process, the insulation layer 13 may be regarded as evenly existing between the planarized layer 12 and the bottom of the bank 17 so long as these minute holes or missing parts are so slight as not to adversely affect the quality of the organic EL element and the organic EL display panel. In other words, it is possible to assume that the planarized layer 12 has its upper surface coated with at least one of the insulation layer 13 and the pixel electrode 14. The foregoing may apply equally to the following embodiments and modifications thereof.

[5. Method for Producing Organic EL Display Panel 100]

Figure 4:
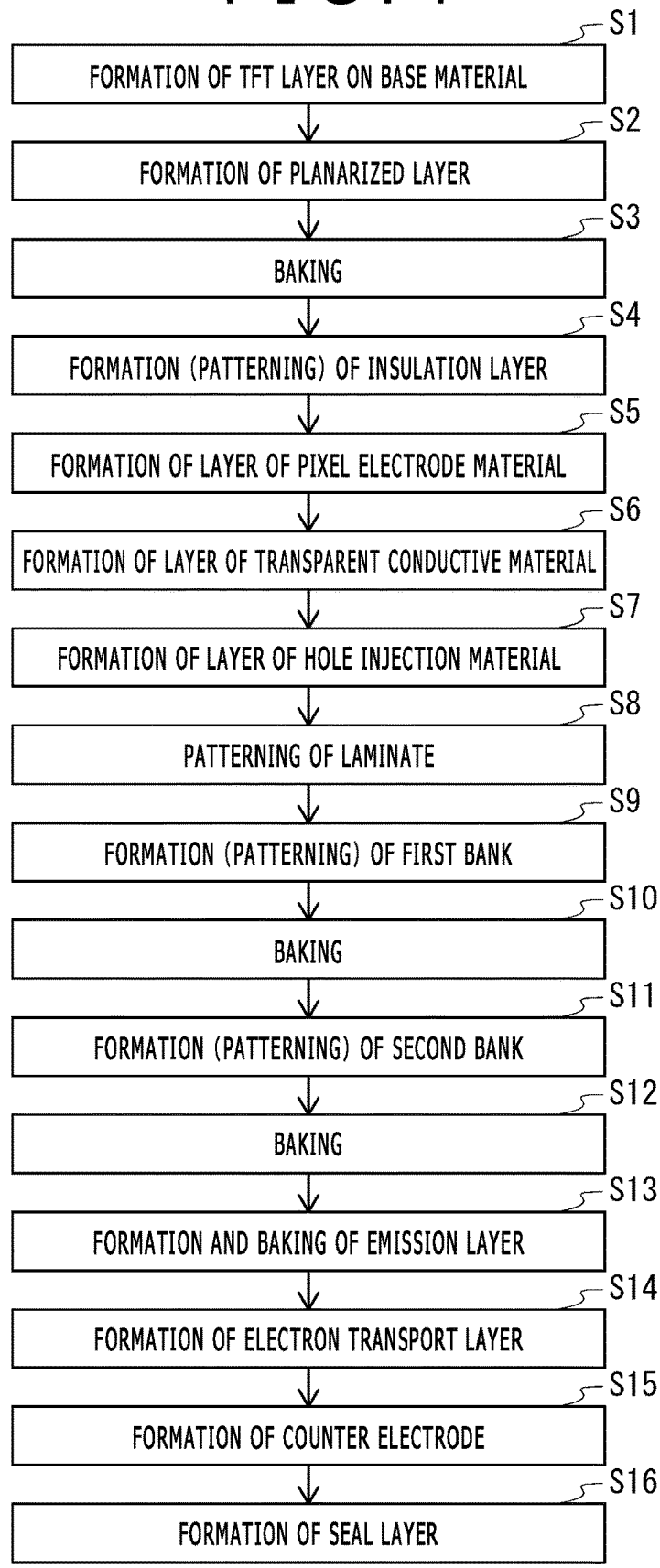
FIG. 4 is a schematic diagram illustrating a process of producing the organic EL display panel illustrated in FIG. 1.

The following is a description illustrating (with reference to FIGS. 4, 5A, 5B, 5C, 5D, 6A, 6B, 6C, 7A, 7B, 7C, 8A, 8B, 9A, 9B and 9C) an example of the method for producing the organic EL display panel 100 pertaining to this embodiment. FIG. 4 is a schematic flow diagram for production of the organic EL display panel 100. FIGS. 5A, 5B, 5C, 5D, 6A, 6B, 6C, 7A, 7B, 7C, 8A, 8B, 9A, 9B and 9C are partial schematic sectional views illustrating the process of producing the organic EL display panel 100.

Figure 5A:
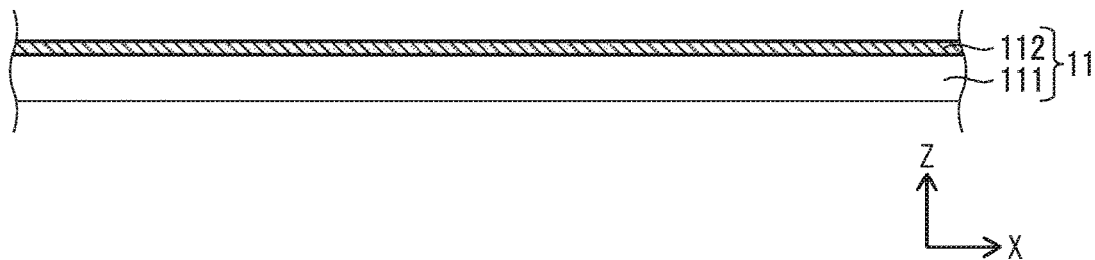
FIGS. 5A, 5B, 5C and 5D are schematic partial sectional views illustrating some steps of the process of producing the organic EL display panel illustrated in FIG. 1.

The process starts with coating the base material 111 with the TFT layer 112, thereby forming the substrate 11, as illustrated in FIG. 5A (Step S1 in FIG. 4).

Figure 5B:
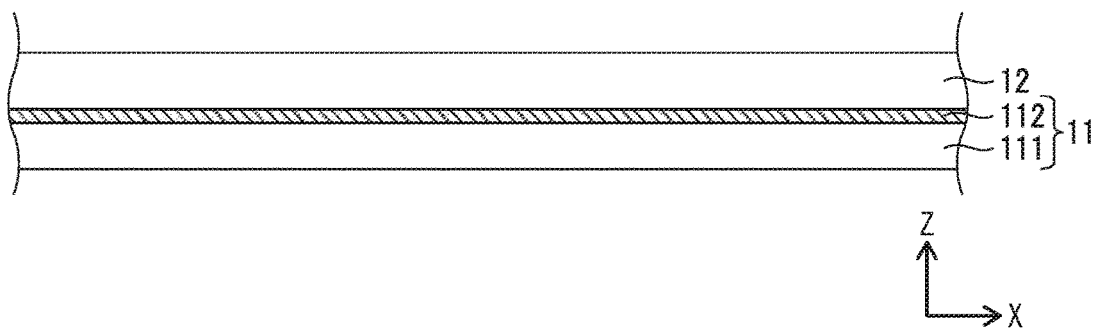

The next step is to coat the substrate 11 with the planarized layer 12, as illustrated in FIG. 5B (Step S2 in FIG. 4). According to this embodiment, the planarized layer 12 is formed from acrylic resin as a photosensitive material of positive type. The process of forming the planarized layer 12 includes coating the substrate 11 with a solution of acrylic resin dissolved in a solvent (for example, propylene glycol-1-monomethyl ether-2-acetate (PGMEA)), following by baking (Step S3 in FIG. 4). Baking may be performed at 150° C. to 210° C. for 180 minutes.

Figure 5C:
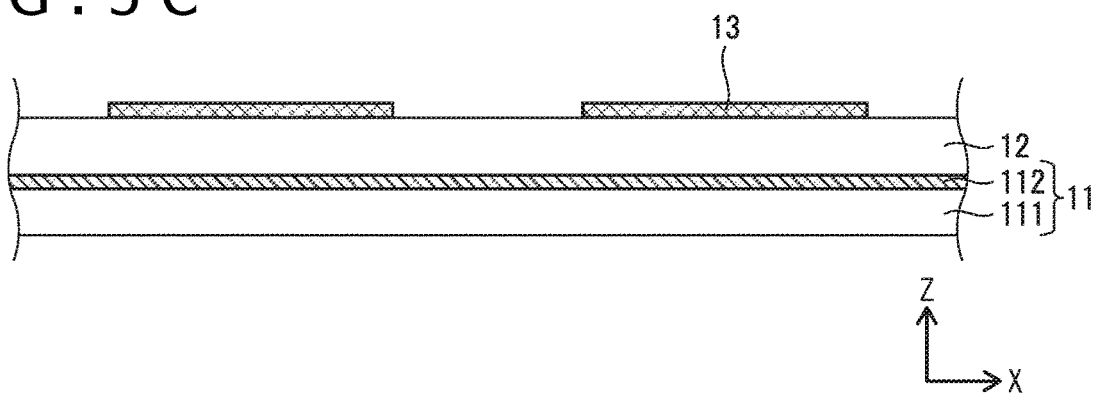

In the next step illustrated in FIG. 5C, the planarized layer 12 is partly coated with the insulation layer 13 (Step S4 in FIG. 4). The insulation layer 13 may have a thickness of 5 to 1000 nm, preferably 50 to 400 nm. The insulation layer 13 is formed from an inorganic material (such as SiN, SiO, chromium oxide, and molybdenum oxide) or an organic resin material incorporated with an inorganic filler or an inorganic pigment, by vapor deposition or sputtering, which is followed by etching for patterning. Incidentally, etching may be replaced by masking the insulation layer 13.

Figure 5D:
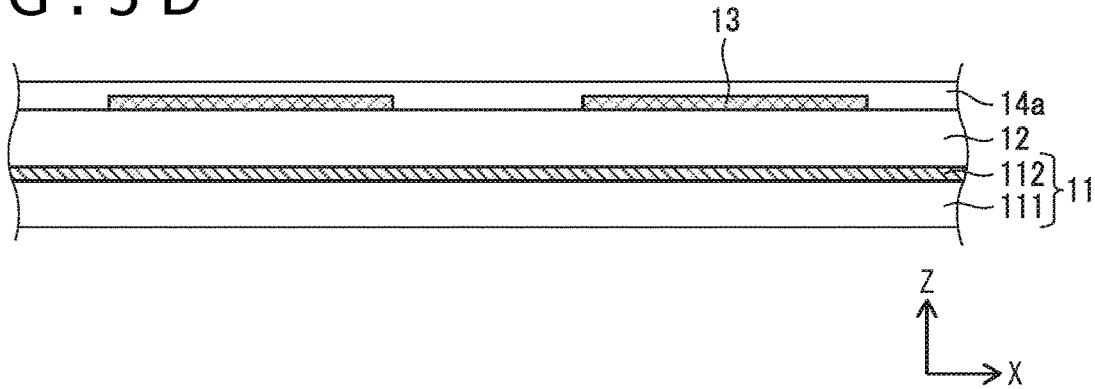

In the next step illustrated in FIG. 5D, the planarized layer 12 and the insulation layer 13 are evenly coated with a layer 14a of pixel electrode material (Step S5 in FIG. 4).

Figure 6A:
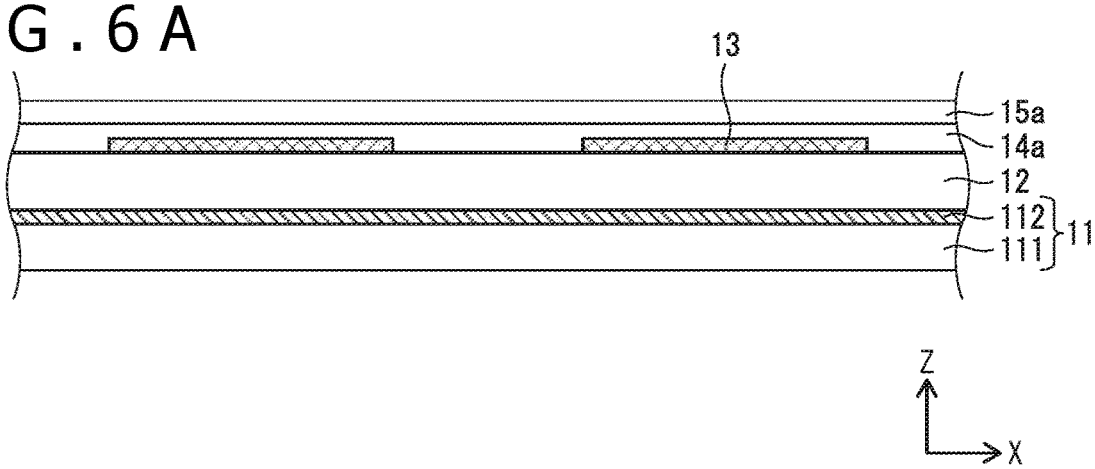
FIGS. 6A, 6B and 6C are schematic partial sectional views illustrating some steps (which follow those in FIGS. 5A, 5B, 5C and 5D) of the process of producing the organic EL display panel.

In the next step illustrated in FIG. 6A, the layer 14a of pixel electrode material is uniformly coated with a layer 15a of transparent conductive material (Step S6 in FIG. 4).

Figure 6B:
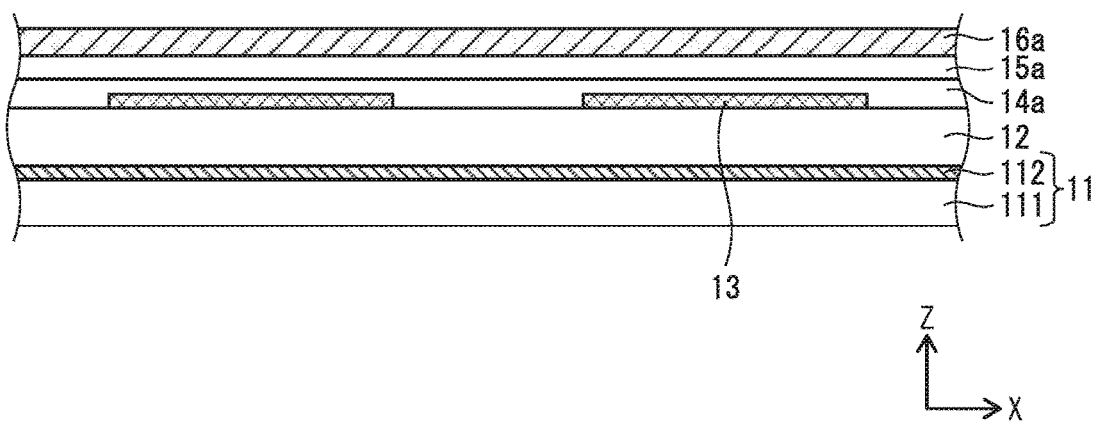

In the next step illustrated in FIG. 6B, the layer 15a of transparent conductive material is uniformly coated with a layer 16a of hole injection material (Step S7 in FIG. 4).

Figure 6C:
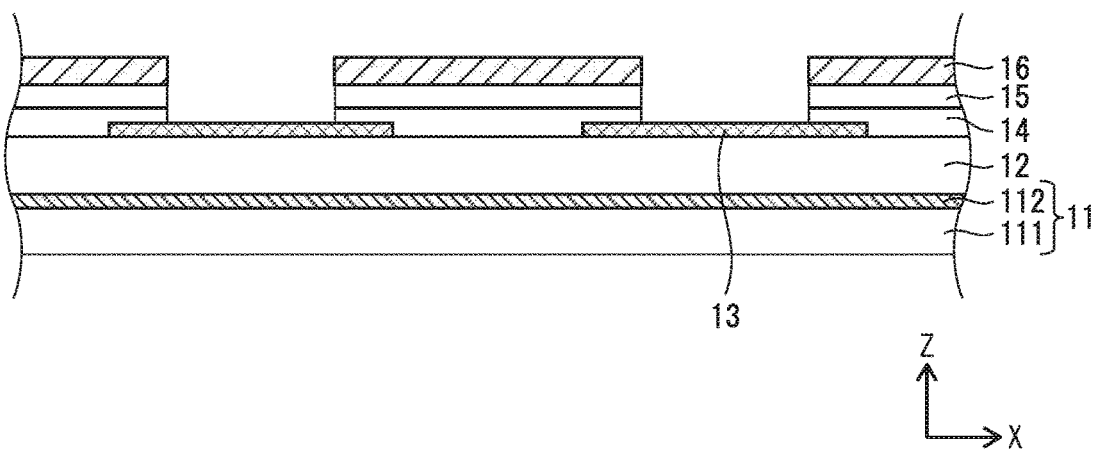

In the next step illustrated in FIG. 6C, etching for patterning is performed on the laminate including the layer 14a of pixel electrode material, the layer 15a of transparent conductive material, and the layer 16a of hole injection material (Step S8 in FIG. 4). This patterning forms the pixel electrode 14, the transparent conductive layer 15, and the hole injection layer 16 at one time.

Figure 7A:
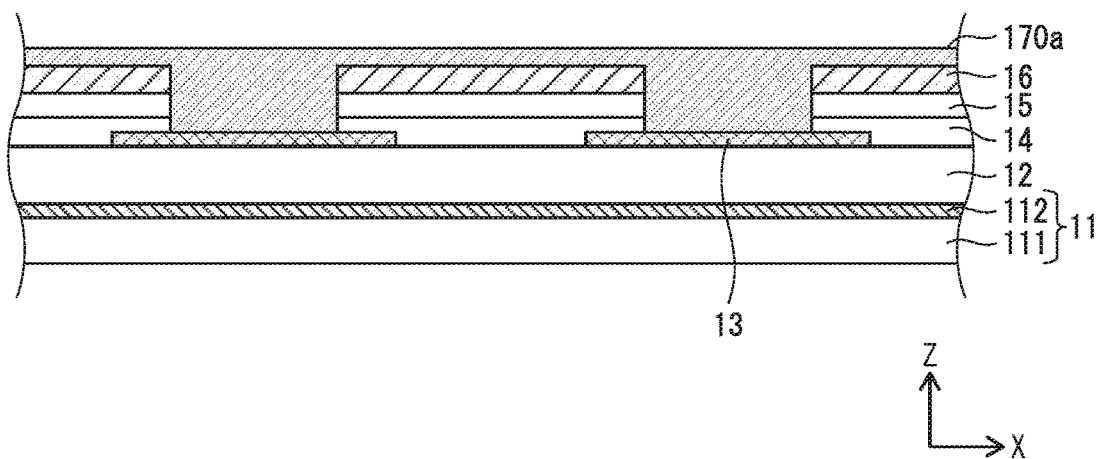
FIGS. 7A, 7B and 7C are schematic partial sectional views illustrating some steps (which follow those illustrated in FIGS. 6A, 6B and 6C) of the process of producing the organic EL display panel.
Figure 7B:
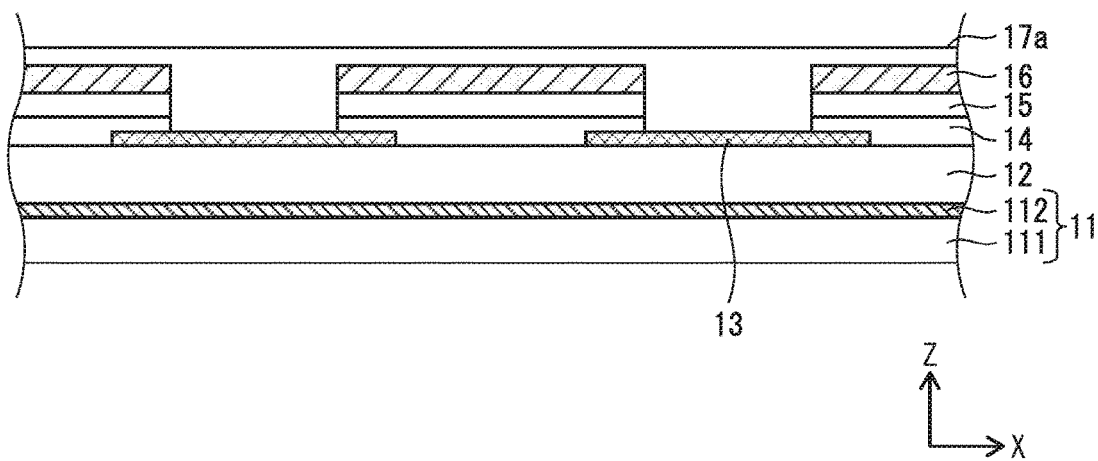

In the next step illustrated in FIG. 7A, the hole injection layer 16 and the insulation layer 13 are coated with a resin for the first bank 17a, so that a layer 170a of material for the first bank is formed. The resin for the first bank may be phenolic resin which is a photosensitive material of positive type. The layer 170a of material for the first bank may be formed from a solution of phenolic resin (as a material for the first bank) dissolved in a solvent (such as a mixture of ethyl lactate and γ-butyrolactone (GBL)) by spin coating on the hole injection layer 16 and the insulation layer 13. The layer 170a of material for the first bank undergoes exposure (through a pattern) and development to form the first bank 17a (FIG. 7B and Step S9 in FIG. 4). After baking, the first bank 17a is completed (Step S10 in FIG. 4).

Figure 7C:
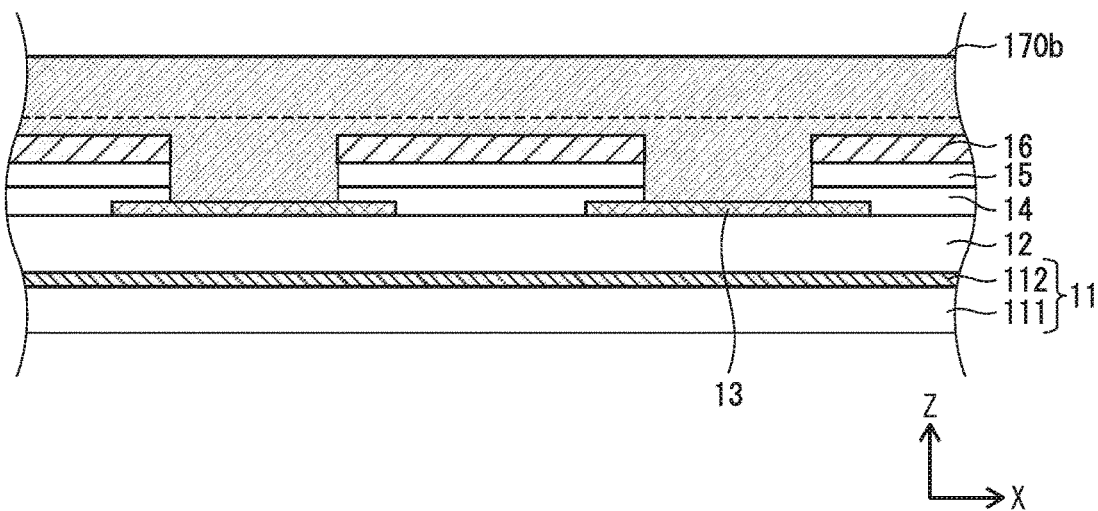

In the next step illustrated in FIG. 7C, the hole injection layer 16, the insulation layer 13, and the first bank 17a are coated with a resin for the second bank 17b, so as to form a layer 170b of material for the second bank. The resin for the second bank is different from the resin for the first bank in photosensitivity (or the ability to cure by light varying in wavelengths).

Figure 8A:
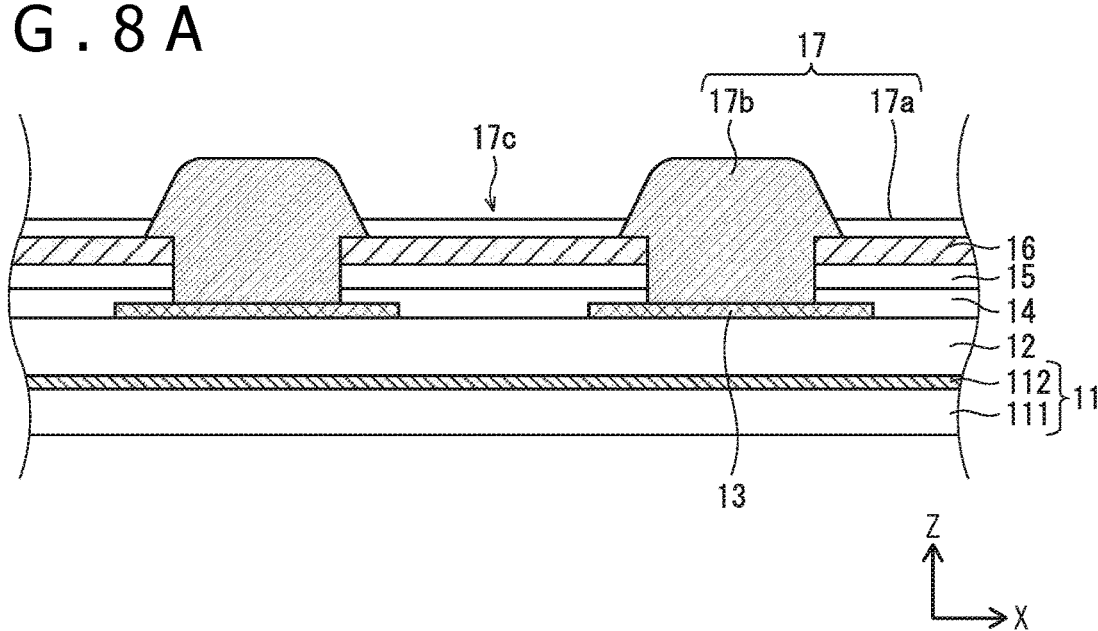
FIGS. 8A and 8B are schematic partial sectional views illustrating some steps (which follow those illustrated in FIGS. 7A, 7B and 7C) of the process of producing the organic EL display panel.

The layer 170b of material for the second bank is thicker than the layer 170a of material for the first bank. The layer 170b of material for the second bank undergoes pattern exposure and development in the same way as used for the layer 170a of material for the first bank, so that the second bank 17b is formed (FIG. 8A and Step S11 in FIG. 4). After baking, the second bank 17b is completed (Step S12 in FIG. 4). Thus, the bank 17 (including the first bank 17a and the second bank 17b) is completed. The resulting bank 17 defines the opening 17c or the region (corresponding to the subpixel) in which the emission layer 18 is formed. Baking of the first and second banks 17a and 17b may be performed at 150° C. to 210° C. for 60 minutes.

Incidentally, the first and second banks 17a and 17b may be formed from the same material at the same time. In this case, the intensity and depth of exposure should be different between the region for forming the first bank 17a and the region for forming the second bank 17b so that the first bank 17a is lower than the second bank 17b.

During the process of forming the bank 17, the bank 17 may have its surface treated with liquid (water, organic solvent, or alkaline solution) or plasma. The surface treatment makes the bank 17 to vary in contact angle with the ink to be applied to the opening 17c or imparts water repellency to the surface of the bank 17. This surface treatment may be performed only on the second bank 17b but not on the first bank 17a.

Figure 8B:
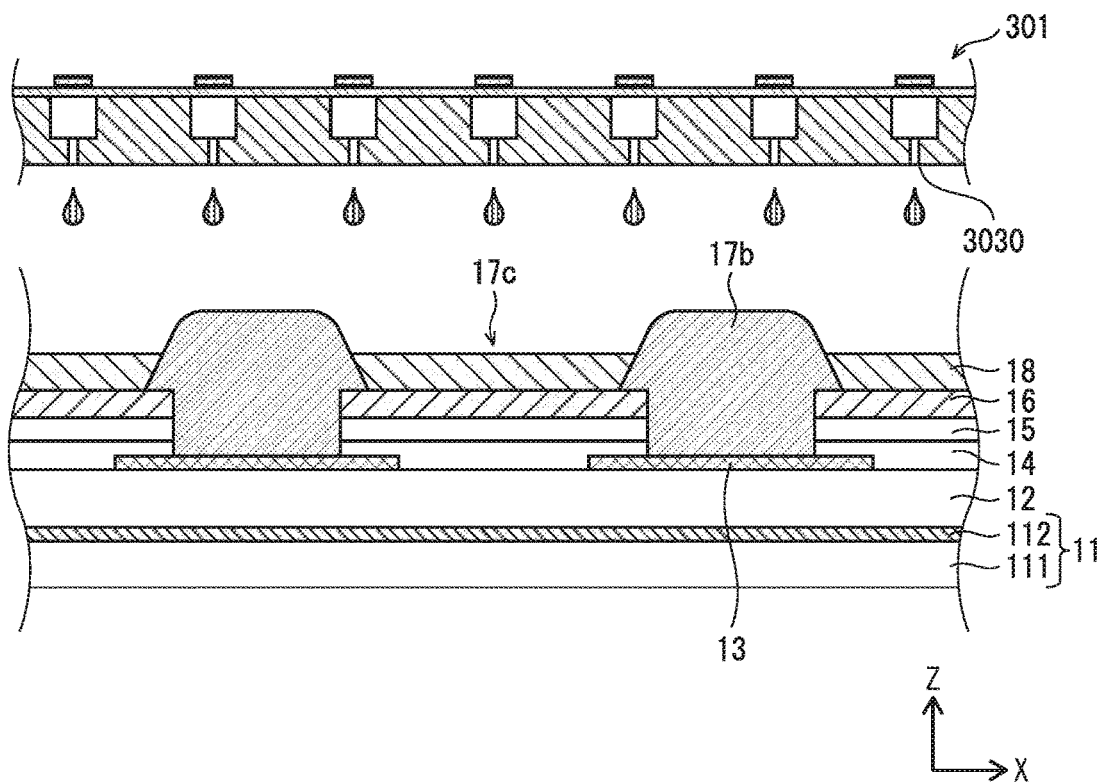

In the next step illustrated in FIG. 8B, the opening 17c (above the hole injection layer 16) is coated with the ink containing the constituent of the emission layer 18. This coating step is accomplished by discharging from a nozzle 3030 of an ink jet head 301. After baking (drying), there is formed the emission layer 18 (FIG. 8B, Step S13 in FIG. 4).

Incidentally, the step according to this embodiment is carried out in such a way that the upper surface of the emission layer 18 is higher (in Z axis) than the upper surface of the first bank 17a, and the first bank 17a is covered with the emission layer 18.

Figure 9A:
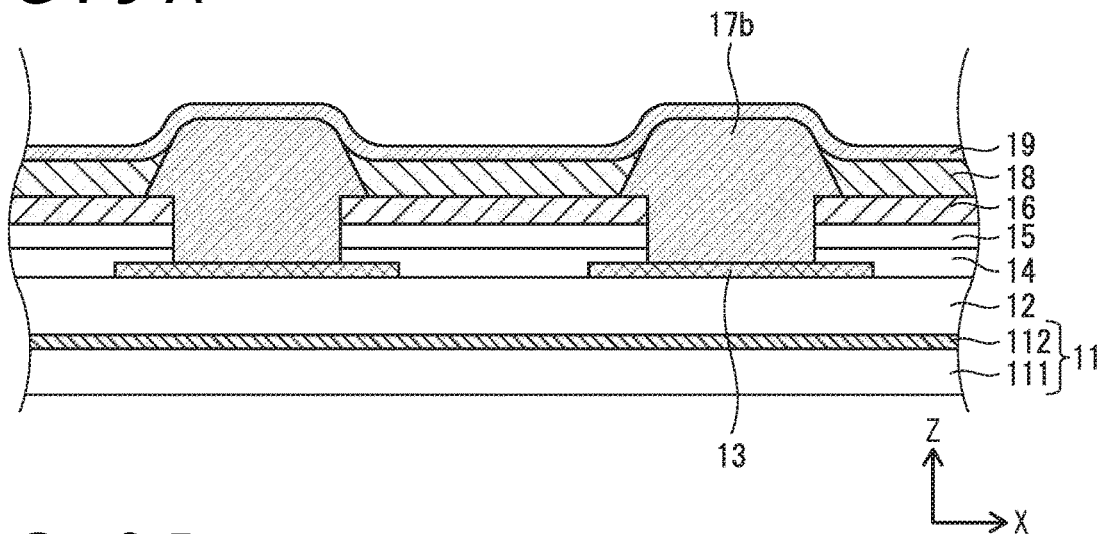
FIGS. 9A, 9B and 9C are schematic partial sectional views illustrating some steps (which follow those illustrated in FIGS. 8A and 8B) of the process of producing the organic EL display panel.

In the next step illustrated in FIG. 9A, the emission layer 18 and the second bank 17b are coated with the electron transport layer 19. This step is accomplished by vacuum deposition or sputtering of the constituent over individual subpixels (Step S14 in FIG. 4).

Figure 9B:
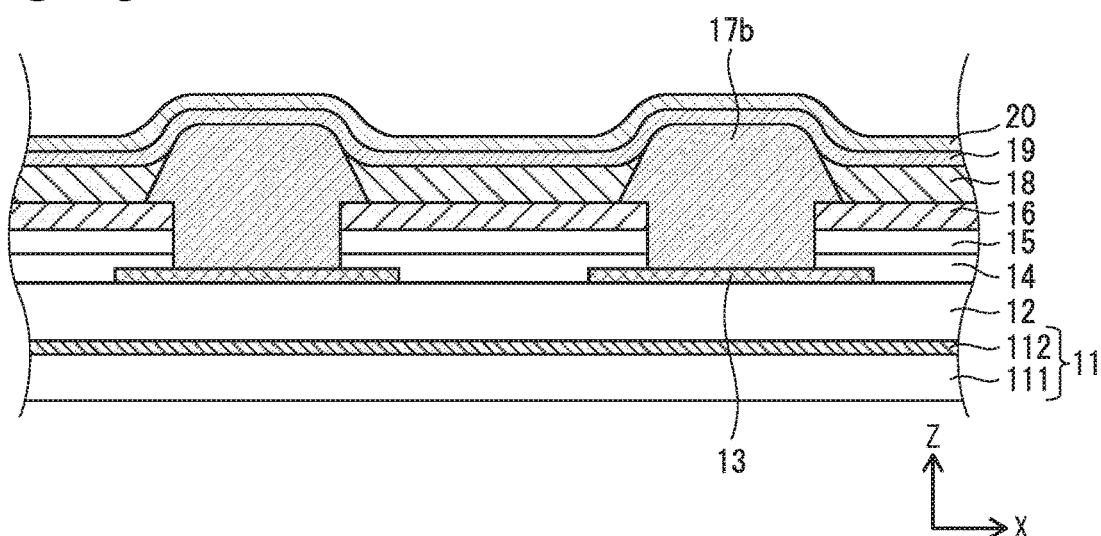

In the next step illustrated in FIG. 9B, the electron transport layer 19 is coated with the counter electrode 20. To be concrete, this step is accomplished by vacuum deposition or sputtering with ITO or IZO (Step S15 in FIG. 4).

Figure 9C:
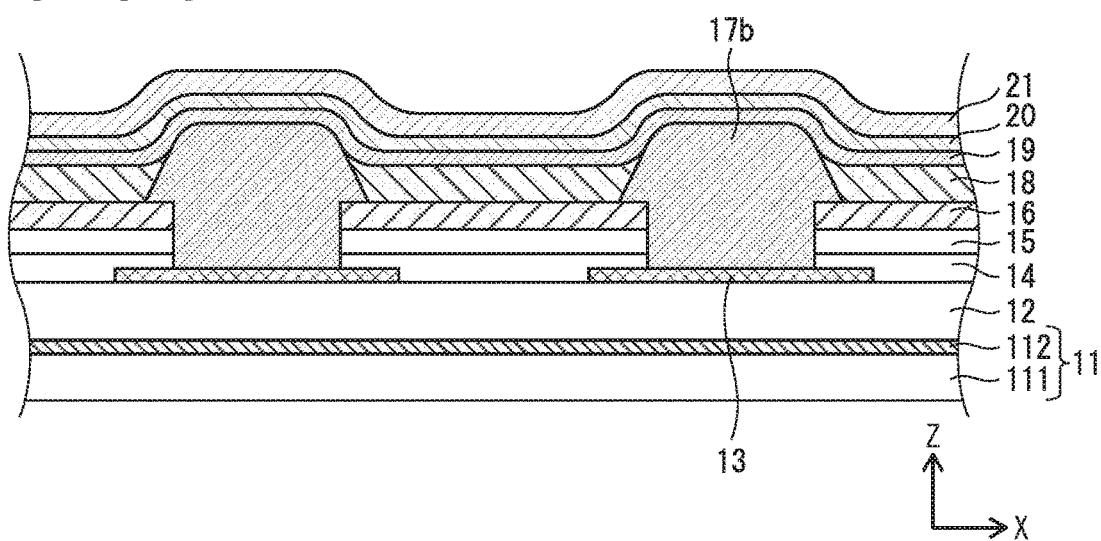

In the next step illustrated in FIG. 9C, the counter electrode 20 is coated with the seal layer 21. This step is accomplished by sputtering or chemical vapor deposition (CVD) with SiN (Step S16 in FIG. 4).

The foregoing steps complete the organic EL display panel 100.

Incidentally, the seal layer 21 may be covered with a color filter or an upper substrate.

Embodiment 2

Figure 10A:
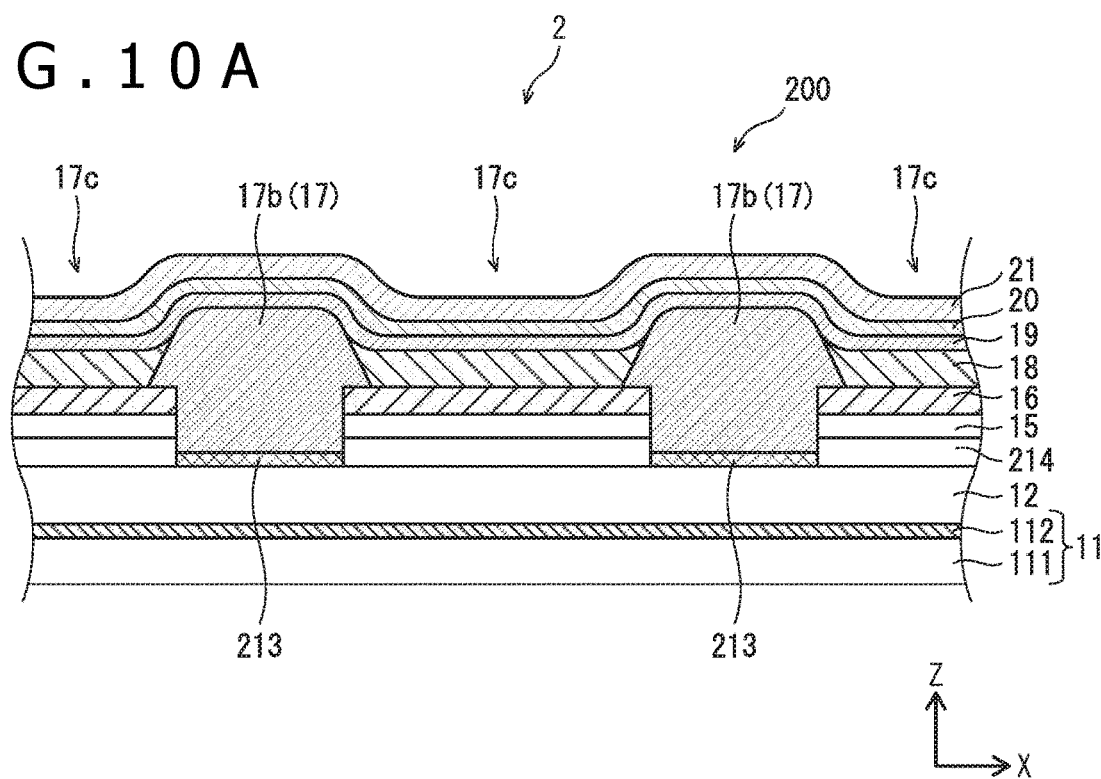
FIG. 10A is a schematic sectional view of an organic EL element pertaining to Embodiment 2.

Embodiment 2 covers an organic EL display panel 200 having an organic EL element 2 as illustrated in FIG. 10A which is a schematic sectional view. The same constituents as those used in Embodiment 1 are given identical symbols, with their explanation omitted for brevity.

The organic EL element 2 according to Embodiment 2 differs from the organic EL element 1 according to Embodiment 1 in that an insulation layer 213 covers only that part which is on the planarized layer 12 and directly below the bank 17 and hence a pixel electrode 214 does not extend over the insulation layer 213. The pixel electrode 214 and the insulation layer 213 are formed respectively from the same material as the pixel electrode 14 and the insulation layer 13 although they differ in structure and hence they are called differently.

The organic EL element 2 has the insulation layer 213, the pixel electrode 214, the transparent conductive layer 15, the hole injection layer 16, and the bank 17. They are produced in the following manner. First, the planarized layer 12 is coated with a laminate composed of a layer of pixel electrode material, a layer of transparent conductive material, and a layer of hole injection material. Then, the laminate undergoes etching for patterning. Subsequently, that part of the planarized layer 12 which has been exposed, with the laminate removed by etching, is coated with the insulation layer 213 by masking. On the resulting insulation layer 213 is formed the bank 17. Alternatively, on the planarized layer 12 is formed the insulation layer 213, and that part of the upper surface of the planarized layer 12 which is not coated with the insulation layer 213 is coated through a mask with the pixel electrode 214, the transparent conductive layer 15, and the hole injection layer 16, and finally the bank 17 is formed.

The organic EL element 2 according to Embodiment 2 is also constructed such that the insulation layer 213 is interposed between the planarized layer 12 and the bottom of the bank 17. This structure prevents moisture adsorbed onto the surface of the planarized layer 12 from moving to the bank 17 and hence prevents moisture from migrating to the bank 17. This eliminates the migration of moisture to the transparent conductive layer 15 through the bank 17. That part of the upper surface of the planarized layer 12 which is not covered with the insulation layer 213 is covered with the pixel electrode 214. In other words, the upper surface of the planarized layer 12 is covered with at least one of the pixel electrode 214 and the insulation layer 213. Consequently, the insulation layer 213 and the pixel electrode 214 prevent moisture adsorbed onto the surface of the planarized layer 12 from migrating to the transparent conductive layer 15. This protects the transparent conductive layer 15 from deterioration. Thus, the resulting organic EL element 2 works with a low driving voltage and has an extended emission life.

Incidentally, there is a possibility that minute gaps exist between the insulation layer 213 and the pixel electrode 214 due to errors in the production process. Despite such problems, the organic EL element 2, which has the insulation layer 213 arranged between the planarized layer 12 and the bottom of the bank 17, is extremely limited in the passage for moisture to migrate from the planarized layer 12 to the transparent conductive layer 15 as compared with the conventional structure not including the insulation layer 213. This structure prevents moisture migration more effectively than the conventional structure and hence protects the transparent conductive layer 15 from deterioration. Thus, the resulting organic EL element 2 works with a low driving voltage and has an extended emission life.

Such gaps are so minute that it can be assumed that those parts on the upper surface of the planarized layer which are not covered with the pixel electrode are substantially covered with the insulation layer.

Embodiment 3

Figure 10B:
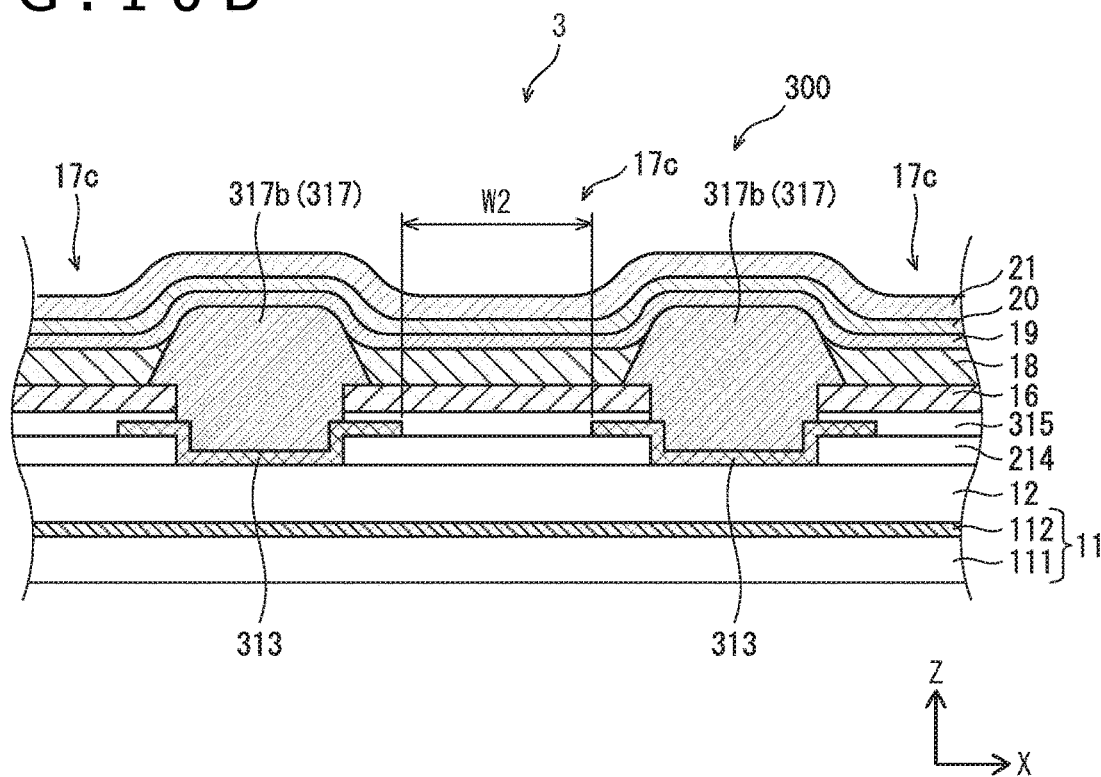
FIG. 10B is a schematic sectional view of an organic EL element pertaining to Embodiment 3.

Embodiment 3 covers an organic EL display panel 300 having an organic EL element 3 as illustrated in FIG. 10B which is a schematic sectional view. The same constituents as those used in Embodiments 1 and 2 are given identical symbols, with their explanation omitted for brevity.

The organic EL element 3 according to Embodiment 3 differs from the organic EL elements 1 and 2 according to Embodiments 1 and 2, in that an insulation layer 313 extends through a part between the planarized layer 12 and a bank 317 to cover the peripheral part of the pixel electrode 214. (FIG. 10B only illustrates a second bank 317b). That part of the insulation layer 313 which covers the peripheral part of the pixel electrode 214 is held between the pixel electrode 214 and a transparent conductive layer 315. Since the insulation layer 313 differs in shape and arrangement, the bank 317 also differs from the bank 17 in shape (FIG. 10B only illustrates the second bank 317b).

The insulation layer 313, the transparent conductive layer 315, and the bank 317 are formed from the same materials as those which are used for the insulation layer 13, the transparent conductive layer 15, and the bank 17, respectively.

The organic EL element 3 may have the insulation layer 313, the pixel electrode 214, the transparent conductive layer 315, the hole injection layer 16, and the bank 317 formed in the following way. First, the planarized layer 12 is uniformly coated with the layer of pixel electrode material, and this layer subsequently undergoes patterning to form the pixel electrode 214. Then, the insulation layer 313 is formed so as to cover that part of the upper surface of the planarized layer 12 which is not covered with the pixel electrode 214 and to cover the peripheral part of the pixel electrode 214. The insulation layer 313 may be formed by patterning the layer of insulation material or by forming the layer of insulation material through a patterning mask. Then, the layer of transparent conductive material and the layer of hole injection material are uniformly formed, and the resulting layers undergo patterning so that there are formed the transparent conductive layer 315 and the hole injection layer 16. The bank 317 is formed on the insulation layer 313. Incidentally, the transparent conductive layer 315 and the hole injection layer 16 may be formed in a prescribed pattern with the help of a mask.

The organic EL element 3 according to Embodiment 3 is also constructed such that the insulation layer 313 is interposed between the planarized layer 12 and the bottom of the bank 317 (FIG. 10B only illustrates the second bank 317b). The structure prevents the moisture adsorbed onto the surface of the planarized layer 12 from migrating to the bank 317. This also prevents moisture from migrating to the transparent conductive layer 315 through the bank 317.

In addition, that part of the upper surface of the planarized layer 12 which is not covered with the pixel electrode 214 is covered with the insulation layer 313. In other words, the upper surface of the planarized layer 12 is covered with at least one of the pixel electrode 214 and the insulation layer 313. Moreover, the pixel electrode 214 has its peripheral part covered with part of the insulation layer 313 (or the peripheral part of the pixel electrode 214 is covered with the insulation layer 313). Consequently, the organic EL element 3 according to Embodiment 3 is superior to the organic EL element 2 according to Embodiment 2 in that there is a remote possibility of any gap occurring between the pixel electrode and the insulation layer, which effectively prevents the permeation of moisture.

Thus, the transparent conductive layer 315 is saved from deterioration and the resulting organic EL element 3 works with a low driving voltage and keeps an extended emission life.

Embodiment 4

Figure 11:
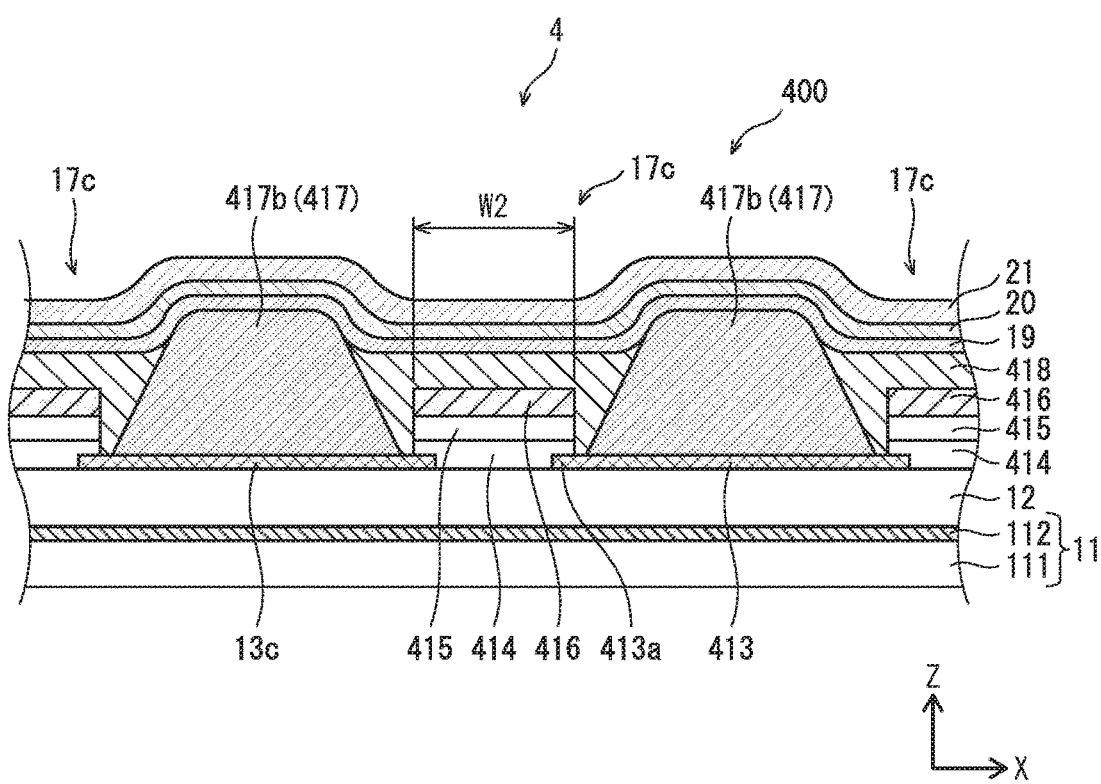
FIG. 11 is a schematic sectional view of an organic EL element pertaining to Embodiment 4.

Embodiment 4 covers an organic EL display panel 400 having an organic EL element 4 as illustrated in FIG. 11 which is a schematic sectional view. The same constituents as those used in Embodiments 1, 2, and 3 are given identical symbols, with their explanation omitted for brevity.

The organic EL element 4 differs from the organic EL element 1 pertaining to Embodiment 1 in that a pixel electrode 414, a transparent conductive layer 415, and a hole injection layer 416 are separate from a second bank 417b. This difference affects the shape of the second bank 417b, the coverage of an insulation layer 413 on the planarized layer 12, and the shape of an emission layer 418. According to this embodiment, the pixel electrode 414, the transparent conductive layer 415, and the hole injection layer 416 are separate from the second bank 417b, and hence the pixel electrode 414, the transparent conductive layer 415, and the hole injection layer 416 do not overlap with a bank 417 in the plan view; however, this is not true in the case of the organic EL elements 1 to 3 according the Embodiments 1 to 3, in which the peripheral parts of the pixel electrode, the transparent conductive layer, and the hole injection layer overlap with the bank in the plan view.

Incidentally, the insulation layer 413, the pixel electrode 414, the transparent conducive layer 415, the hole injection layer 416, the bank 417b, and the emission layer 418 are formed from the same materials as those which are used for the insulation layer 13, the pixel electrode 14, the transparent conducive layer 15, the hole injection layer 16, the bank 17b, and the emission layer 18.

Also, the insulation layer 413, the pixel electrode 414, the transparent conducive layer 415, and the hole injection layer 416 are formed in the same way as used for the organic EL element 1 pertaining to Embodiment 1 except that pattering is performed at different widths.

The organic EL element 4 pertaining to Embodiment 4 is constructed such that the insulation layer 413 is interposed overall between the planarized layer 12 and the bottom of the bank 417 (FIG. 11 only illustrates the second bank 417b). The structure prevents the moisture adsorbed onto the surface of the planarized layer 12 from migrating to the bank 417. This also prevents moisture from migrating to the transparent conductive layer 415 through the bank 417.

In addition, that part of the upper surface of the planarized layer 12 which is not covered with the pixel electrode 214 is covered with the insulation layer 413. In other words, the upper surface of the planarized layer 12 is covered with at least either of the pixel electrode 414 and the insulation layer 413. Moreover, the insulation layer 413 has its peripheral part 413a covered with the pixel electrode 414. This leads to a faint possibility of gaps existing between the insulation layer 413 and the pixel electrode 414. The result is that moisture adsorbed to the surface of the planarized layer 12 is prevented from migrating to the transparent conductive layer 415. Thus, the transparent conductive layer 415 is saved from deterioration and the resulting organic EL element 4 works with a low driving voltage and keeps an extended emission life.

<<Additional Effects of Organic EL Elements Pertaining to Embodiments 3 and 4>>

As mentioned above, the organic EL elements 1 to 4 pertaining to Embodiments 1 to 4 are so constructed as to prevent moisture migration from the planarized layer to the transparent conductive layer. As a result, the transparent conductive layer is saved from deterioration and the resulting organic EL element works with a low driving voltage and keeps an extended emission life.

By the way, the organic EL elements 3 and 4 pertaining to Embodiments 3 and 4 are each constructed differently from what was mentioned above. Consequently, they produce additional effects as described below.

Forming an emission layer by wet process with an ink jet apparatus is undesirable because ink for formation of the emission layer applied onto the inside of an opening creeps up the wall of a bank (or the inside surface of the opening). As a result, in a cross section of the emission layer after drying, the upper surface of the emission layer is flat at the center of the opening and curved at the part adjoining to the bank due to creeping. That is, the emission layer has an uneven thickness. This results in an outgoing light with a low color purity, which occurs because the outgoing light mixes with the reflected external light which has an unexpected spectrum. This is a problem remaining unsolved up to now.

Since the reflection of external light occurs mainly on the surface of the pixel electrode; in other words, the reflection of external light is attributable to the limited area of the pixel electrode within the opening in the plan view. In the organic EL element 1 pertaining to Embodiment 1 illustrated in FIG. 3, W1 indicates the width which contributes to the reflection of external light from the surface of the pixel electrode. Also, in the organic EL element 3 illustrated in FIG. 10B and the organic EL element 4 illustrated in FIG. 11 pertaining to Embodiments 3 and 4, respectively, W2 indicates the width which contributes to the reflection of external light from the surface of the pixel electrode. It is noted from FIGS. 10B and 11 that the organic EL elements 3 and 4 have a comparatively uniform thickness and also have the emission layer with a comparatively flat upper surface within the width W2 contributive to the reflection of external light.

Figure 12A:
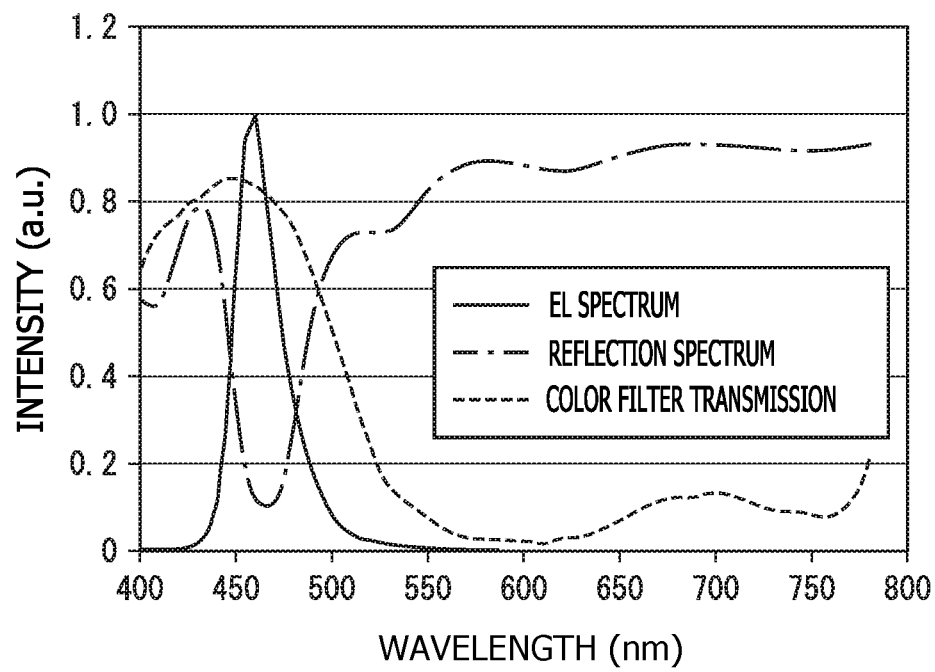
FIG. 12A is a graph illustrating the optical properties of the organic EL element without a color filter pertaining to Embodiment 1.
Figure 12B:
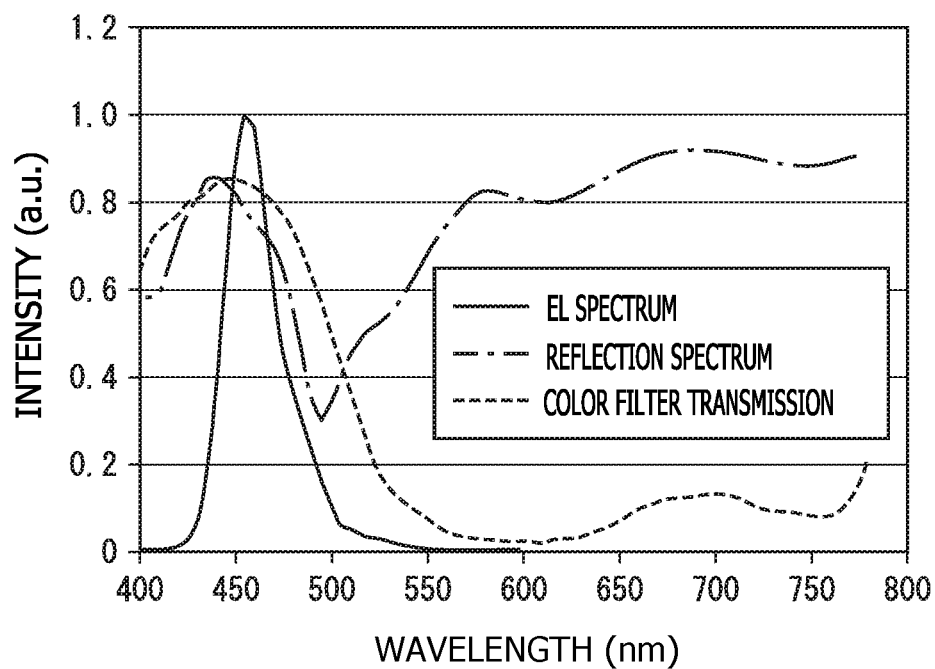
FIG. 12B is a graph illustrating the optical properties of the organic EL element with a color filter pertaining to Embodiment 1.

The conventional organic EL element which does not have the insulation layer 13 is equivalent to the organic EL element 1 pertaining to Embodiment 1 in the width (denoted by W1) which contributes to the reflection of external light. This suggests that the conventional organic EL element may be substituted by the organic EL element 1 pertaining to Embodiment 1 when the optical properties are investigated. The results of such investigation are illustrated in FIGS. 12A and 12B. FIG. 12A is a graphical representation of the relation between wavelength and intensity for the EL spectrum, the reflection spectrum, and the color filter transmission in the case of the organic EL element 1 which has no color filter. FIG. 12B is a graphical representation of the relation between wavelength and intensity for the EL spectrum, the reflection spectrum, and the color filter transmission in the case of the organic EL element 1 which has a color filter.

Figure 13A:
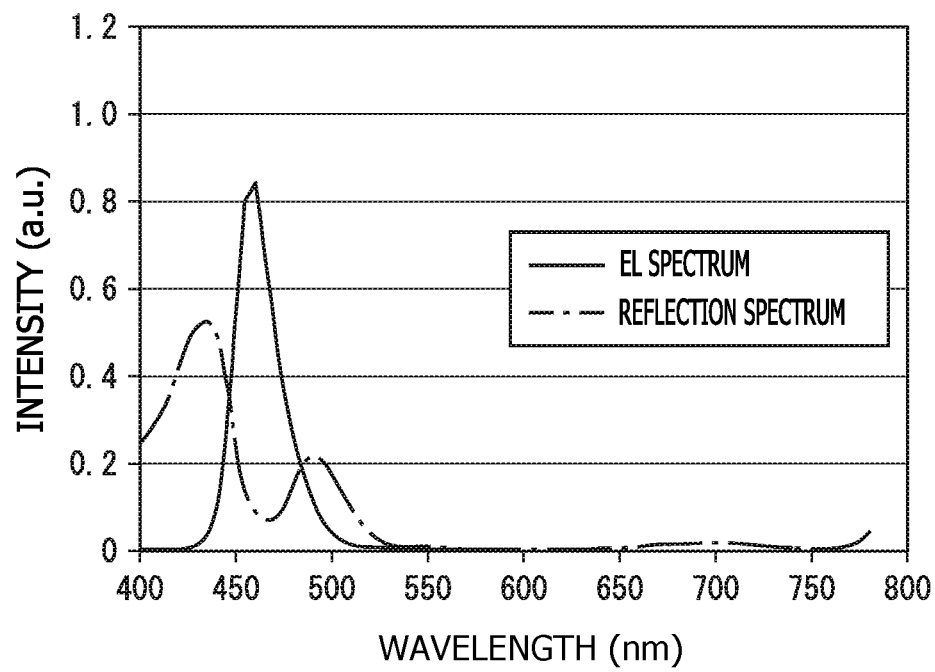
FIG. 13A is a graph illustrating the optical properties of the organic EL element without a color filter pertaining to Embodiment 4.
Figure 13B:
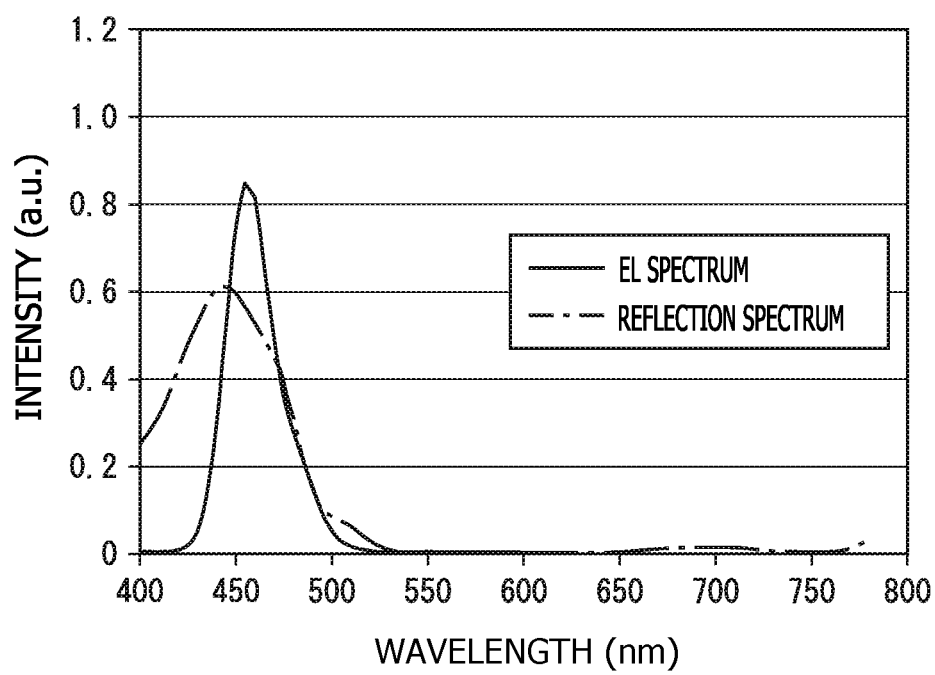
FIG. 13B is a graph illustrating the optical properties of the organic EL element with a color filter pertaining to Embodiment 4.

FIG. 13A is a graphical representation of the relation between wavelength and intensity for the EL spectrum, the reflection spectrum, and the color filter transmission in the case of the organic EL element 4 pertaining to Embodiment 4 which has no color filter. FIG. 13B is a graphical representation of the relation between wavelength and intensity for the EL spectrum, the reflection spectrum, and the color filter transmission in the case of the organic EL element 4 pertaining to Embodiment 4 which has a color filter.

It is noted from FIGS. 12A and 12B that the outgoing light has the reflection spectrum with a comparatively high intensity outside the desirable range of wavelength which is 440 to 480 nm. This reflection spectrum deteriorates the color purity.

On the other hand, it is noted from FIGS. 13A and 13B that the reflection spectrum has its intensity greatly decreased outside the desirable range of wavelength mentioned above. This suggests that the organic EL element 4 pertaining to Embodiment 4 is superior to the organic EL element 1 (or the conventional organic EL element) in color purity.

It is concluded from the foregoing that the organic EL elements 3 and 4 pertaining respectively to Embodiments 3 and 4 produce the effect of improving the outgoing light in color purity.

<<Additional Effects of Organic EL Elements Pertaining to Embodiments 1 to 4>>

The organic EL elements 1 to 4 pertaining respectively to Embodiments 1 to 4 are constructed such that the insulation layer is arranged under the bank. The insulation layer may be formed from a material with low light reflectivity or high light absorptivity. In this case, the insulation layer plays a role of black matrix, thereby reducing the amount of light reflected by the bottom of the bank and hence reducing the amount of outgoing light. This results in an improvement in contrast.

The higher the light absorptivity, the more desirable the insulation layer. Therefore, the insulation layer may be formed from a material (black material) having a higher light absorptivity than the material for the bank. Such a material includes, for example, chromium oxide and organic resin materials containing an inorganic filler or pigment.

<<Modifications>>

The present disclosure has been described above with reference to some embodiments; however, the scope of the present disclosure is not restricted to such embodiments. They may be variously modified as exemplified below.

(1) Although the organic EL elements 1 to 4 pertaining to the foregoing embodiments have the hole injection layer and the electron transport layer, either or both of them may be omitted.

(2) The organic EL elements 1 to 4 may additionally have one or both of the hole transport layer and the electron injection layer and another layer such as a passivation film.

(3) Although the organic EL elements 1 to 4 pertaining to the foregoing embodiments are of so-called line bank type, they may be of pixel bank type.

(4) Although the organic EL elements 1 to 4 pertaining to the foregoing embodiments have the emission layer formed by ink-jet wet process, the wet process may be replaced by any dry process such as vapor deposition.

(5) In the foregoing embodiments, one pixel includes three subpixels that emit red, green, and blue light. Such three colors may be replaced by one color or two colors. It is also possible to add a yellow color to the three colors. It is not always necessary that one pixel includes subpixels each having one color; for example, there may be two subpixels emitting a blue color. It will be possible to arrange more than one subpixel for each color. The subpixels constituting the pixel may be arranged in any order instead of the order of red, green, and blue.

(6) In the organic EL elements 1 to 4, the pixel electrode is the anode and the counter electrode is the cathode. However, this arrangement may be reversed.

(7) The organic EL elements 1 to 4 may additionally have a bus bar (auxiliary electrode) to reduce the voltage drop due to resistance arising from the counter electrode.

The organic EL elements according to the present disclosure will find use for the display panel of electronic devices in various fields including televisions, personal computers, portable terminals, and displays for business use.

The present disclosure contains subject matter related to that disclosed in Japanese Priority Patent Application JP 2016-197349 filed in the Japan Patent Office on Oct. 5, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. An organic electroluminescence (EL) element, comprising:
    a substrate;
    a planarized layer on the substrate;
    an insulation layer of inorganic material, wherein the insulation layer is on the planarized layer such that a region corresponding to a subpixel of the planarized layer is at least partly exposed;
    a pixel electrode on a peripheral part of the insulation layer and on the exposed region of the planarized layer;
    a bank on the insulation layer, wherein
        the insulation layer is between a bottom of the bank and the planarized layer, and
        an upper surface of the planarized layer is coated with at least one of the pixel electrode or the insulation layer;
    a transparent conductive layer comprising a metal oxide, wherein the transparent conductive layer is on the pixel electrode, wherein
        the pixel electrode is between the peripheral part of the insulation layer and the transparent conductive layer in a lamination direction, and
    a bottom surface of the pixel electrode is in contact with the peripheral part of the insulation layer;
    a hole injection layer above the transparent conductive layer, wherein the transparent conductive layer is between the hole injection layer and the pixel electrode;
    an emission layer in an opening in the bank, wherein
        the emission layer is at least partially in contact with the hole injection layer, and
        the hole injection layer is between the emission layer and the transparent conductive layer, and
        the opening corresponds to the subpixel; and
    a counter electrode above the emission layer.

2. The organic EL element according to claim 1, wherein the insulation layer continuously extends from a first part between the planarized layer and the bank to a second part between a peripheral part of the pixel electrode and the planarized layer.

3. The organic EL element according to claim 1, wherein the insulation layer continuously extends from a first part between the planarized layer and the bank to a second part between a peripheral part of the pixel electrode and the planarized layer.

4. The organic EL element according to claim 1, further comprising a laminate which includes the pixel electrode and the transparent conductive layer, wherein a first peripheral part of the transparent conductive layer and a second peripheral part of the pixel electrode are overlapped with the bank in a plan view.

5. The organic EL element according to claim 1, further comprising a laminate which includes the pixel electrode and the transparent conductive layer, wherein the laminate is separate from the bank in the opening.

6. The organic EL element according to claim 1, wherein the insulation layer comprises the inorganic material, and the inorganic material has a higher light absorptivity than a light absorptivity of material for the bank.

7. The organic EL element according to claim 6, wherein the inorganic material is chromium oxide.

8. The organic EL element according to claim 1, wherein the insulation layer comprises one of silicon nitride (SiN), silicon oxide (SiO), chromium oxide, or molybdenum oxide.

9. The organic EL element according to claim 1, further comprising a seal layer on the counter electrode, wherein the seal layer comprises one of silicon nitride (SiN) or silicon oxide nitride (SiON).

10. The organic EL element according to claim 1, further comprising an electron transport layer on the emission layer, wherein the electron transport layer is in contact with the emission layer.

11. The organic EL element according to claim 1, wherein the pixel electrode has a specific moisture permeability, and
    the pixel electrode is configured to prevent movement of moisture from the planarized layer to the transparent conductive layer based on the specific moisture permeability.

12. The organic EL element according to claim 1, wherein the bank covers a peripheral portion of the hole injection layer, and a remaining portion of the hole injection layer other than the peripheral portion is exposed in the opening corresponding to the subpixel.

* * * * *